United States Patent
Ikedo

(10) Patent No.: US 10,455,176 B2
(45) Date of Patent: Oct. 22, 2019

(54) IMAGE SENSOR AND IMAGE CAPTURING APPARATUS

(71) Applicant: CANON KABUSHIKI KAISHA, Tokyo (JP)

(72) Inventor: Hideki Ikedo, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/747,001

(22) PCT Filed: Jul. 7, 2016

(86) PCT No.: PCT/JP2016/003230
§ 371 (c)(1),
(2) Date: Jan. 23, 2018

(87) PCT Pub. No.: WO2017/026088
PCT Pub. Date: Feb. 16, 2017

(65) Prior Publication Data
US 2018/0220091 A1  Aug. 2, 2018

(30) Foreign Application Priority Data

Aug. 11, 2015 (JP) .................................. 2015-159135

(51) Int. Cl.
*H04N 5/374* (2011.01)
*H04N 5/361* (2011.01)
(Continued)

(52) U.S. Cl.
CPC ......... *H04N 5/374* (2013.01); *G02B 27/0025* (2013.01); *H01L 27/1461* (2013.01);
(Continued)

(58) Field of Classification Search
CPC .... H04N 5/374; H04N 5/2253; H04N 5/2254; H04N 5/3572; H04N 5/361;
(Continued)

(56) References Cited

U.S. PATENT DOCUMENTS 7,507,944 B1  3/2009  Arnzen et al.
2005/0186745 A1  8/2005  Lee
(Continued)

FOREIGN PATENT DOCUMENTS

JP  2014-116380 A  6/2014

OTHER PUBLICATIONS

Itonaga et al., A Novel Curved CMOS Image Sensor Integrated with Imaging System, 2014 Symposium on VLSI Technology Digest of Technical Papers, 2014, Vo. 2014, pp. 1-2.
(Continued)

*Primary Examiner* — Twyler L Haskins
*Assistant Examiner* — Fayez Bhuiyan
(74) *Attorney, Agent, or Firm* — Cowan, Liebowitz & Latman, P.C.

(57) ABSTRACT

An image sensor in which at least a portion of an imaging plane thereof has a curved shape, wherein the imaging plane includes a plurality of pixels that are two-dimensionally arranged, each of the plurality of pixels having: a photoelectric conversion region that is provided with an impurity region of a first conductivity type that is formed in a semiconductor substrate; and an impurity region of a second conductivity type that is formed on a substrate surface side of the photoelectric conversion region, and impurity concentration in the impurity region of the second conductivity type varies depending on a position on the imaging plane.

14 Claims, 9 Drawing Sheets

(51) Int. Cl.
  *H04N 5/225* (2006.01)
  *G02B 27/00* (2006.01)
  *H01L 27/146* (2006.01)
  *H04N 5/357* (2011.01)

(52) U.S. Cl.
  CPC .. *H01L 27/14605* (2013.01); *H01L 27/14607* (2013.01); *H01L 27/14689* (2013.01); *H04N 5/2253* (2013.01); *H04N 5/2254* (2013.01); *H04N 5/3572* (2013.01); *H04N 5/361* (2013.01)

(58) Field of Classification Search
  CPC .......... G02B 27/0025; H01L 27/14605; H01L 27/14607; H01L 27/1461; H01L 27/14689
  See application file for complete search history.

(56) References Cited

U.S. PATENT DOCUMENTS

| | | |
|---|---|---|
| 2006/0273361 A1 | 12/2006 | Tanaka et al. |
| 2010/0149397 A1 | 6/2010 | Mutoh |
| 2012/0217606 A1 | 8/2012 | Itonaga |
| 2013/0075587 A1* | 3/2013 | Suzuki .............. H01L 27/14618 250/208.1 |
| 2014/0291796 A1 | 10/2014 | Ishii et al. |
| 2015/0243702 A1* | 8/2015 | Itagaki ................... H04N 5/341 348/272 |

OTHER PUBLICATIONS

The above US and npl references were cited in the International Search Report dated Aug. 16, 2016 of International Application No. PCT/JP2016/003230.

* cited by examiner

[Fig. 1]
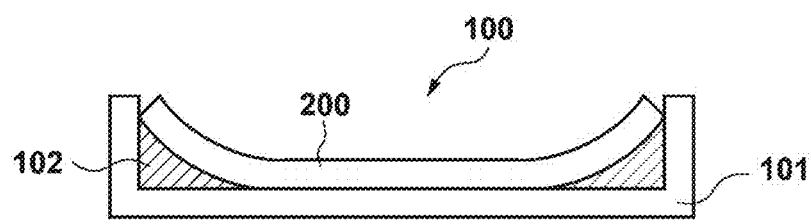
[Fig. 2]
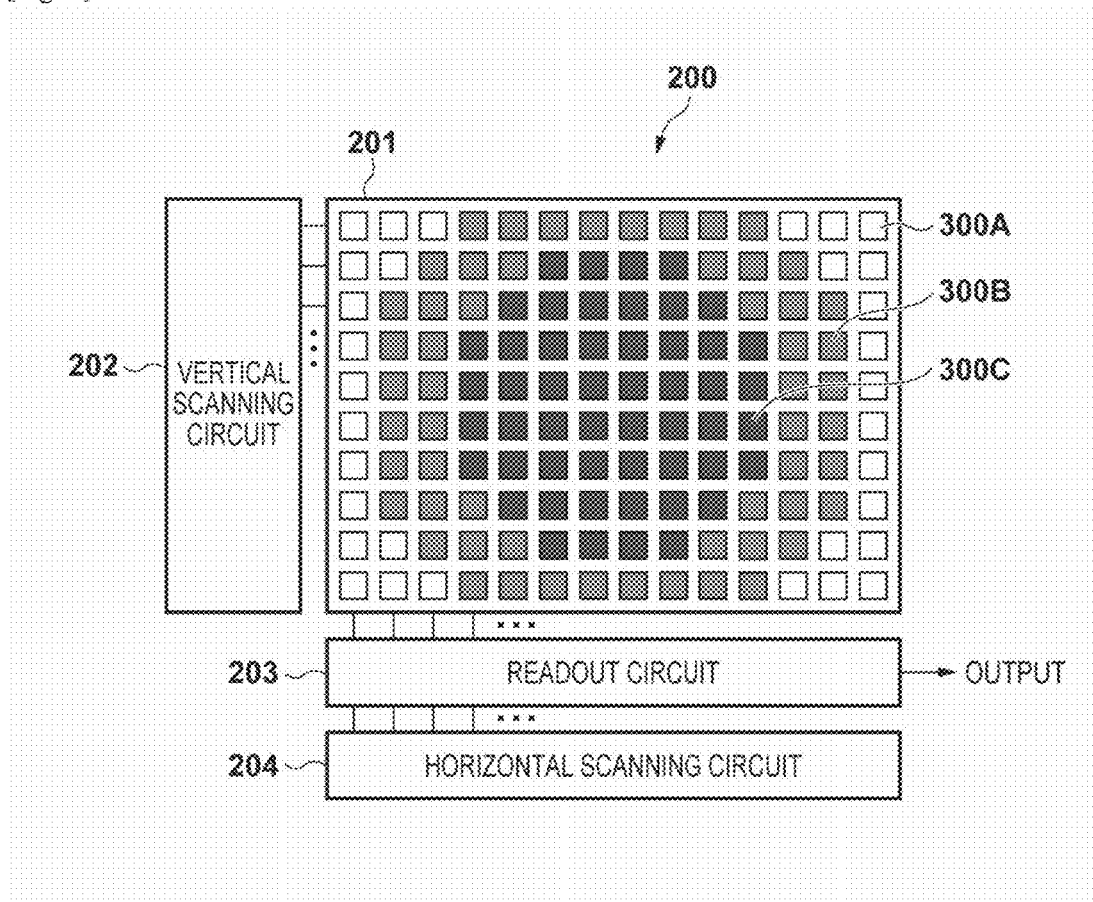

[Fig. 3]
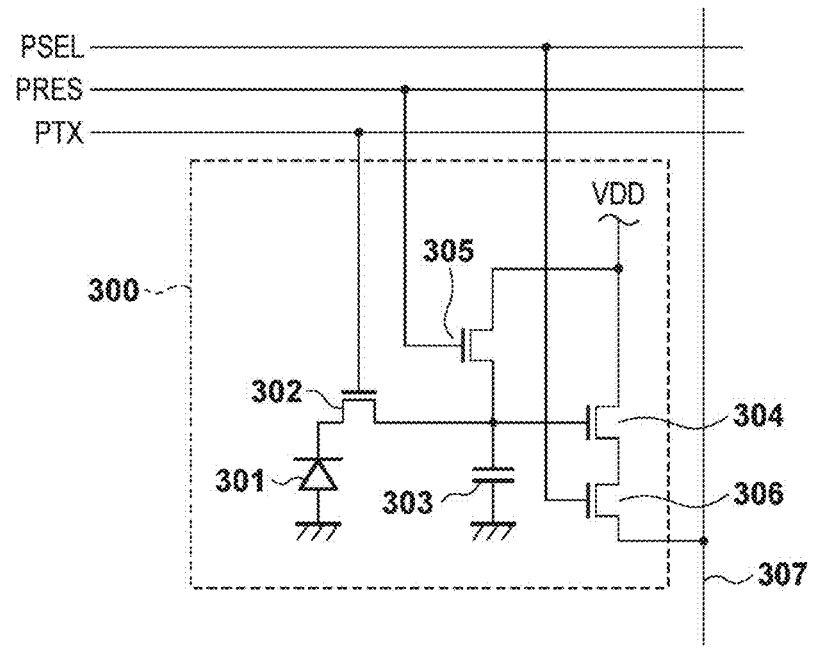

[Fig. 4A]
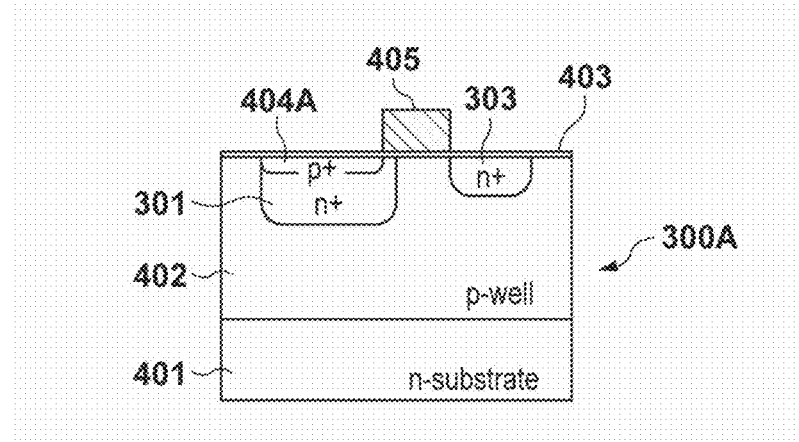
[Fig. 4B]
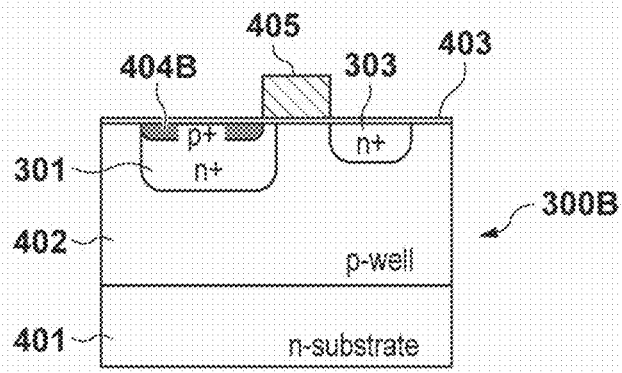
[Fig. 4C]
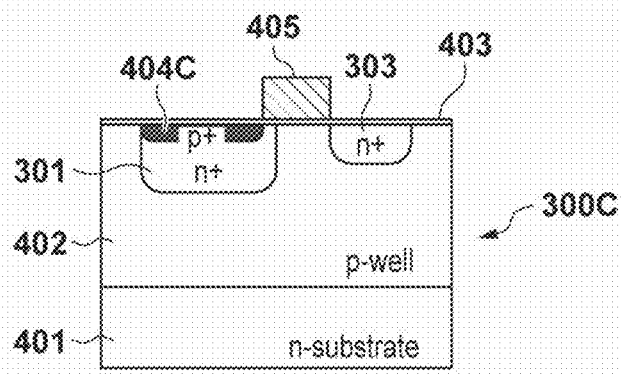

[Fig. 5A]
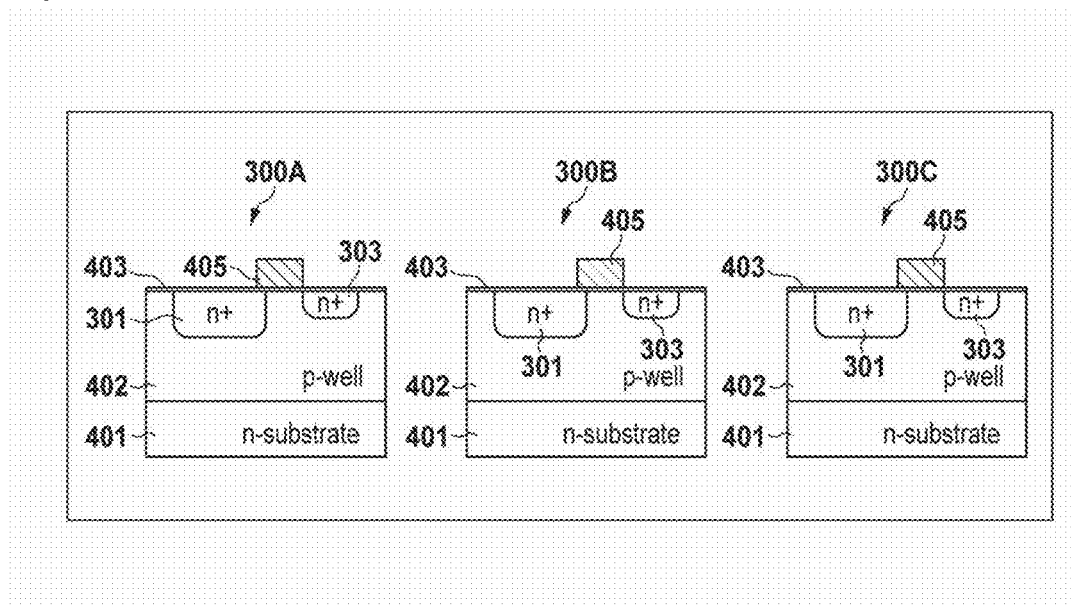
[Fig. 5B]
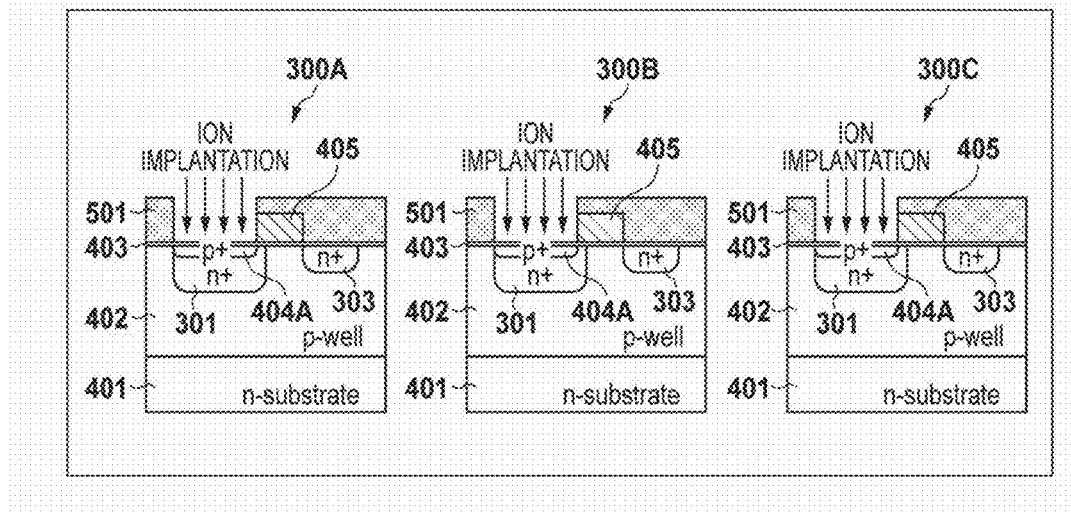

[Fig. 5C]
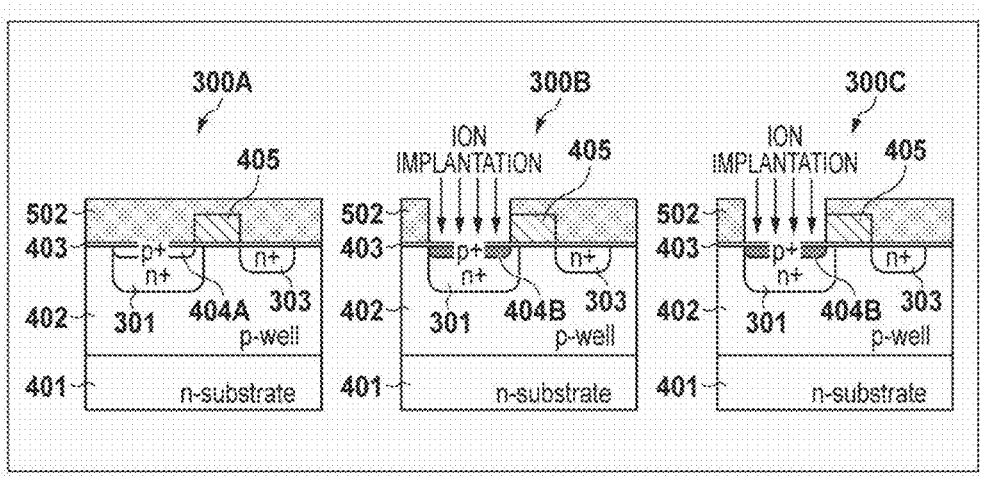
[Fig. 5D]
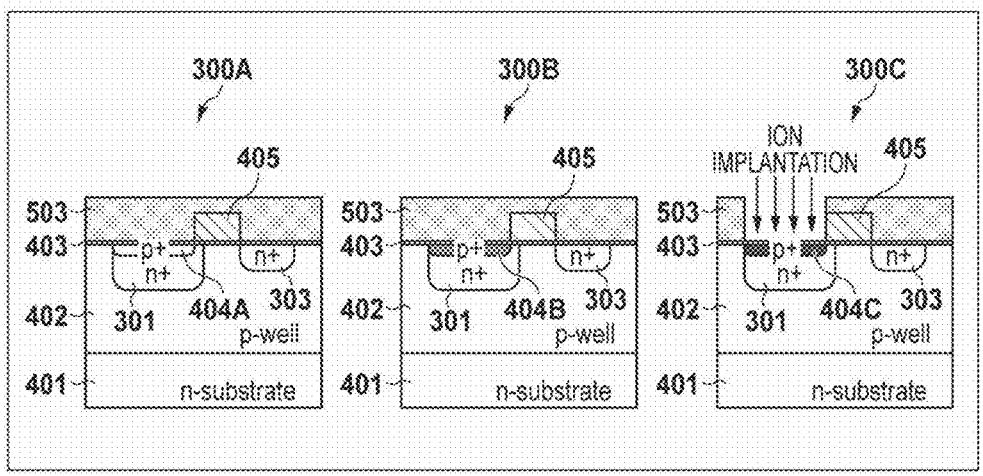

[Fig. 6A]
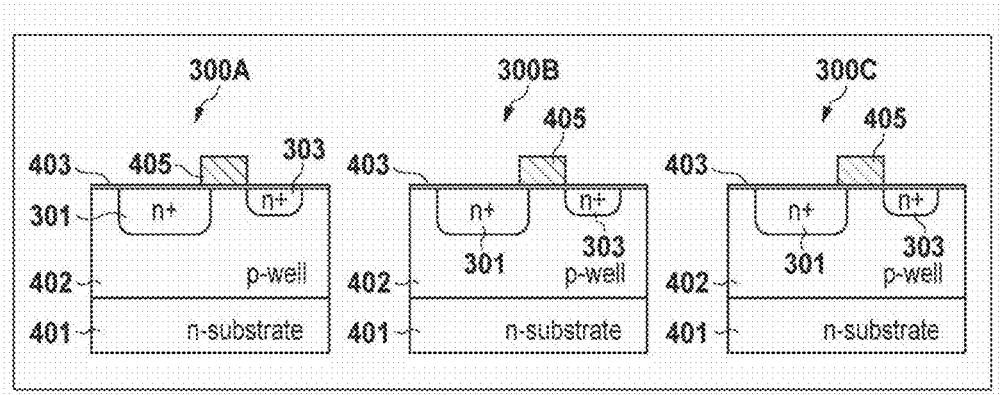
[Fig. 6B]
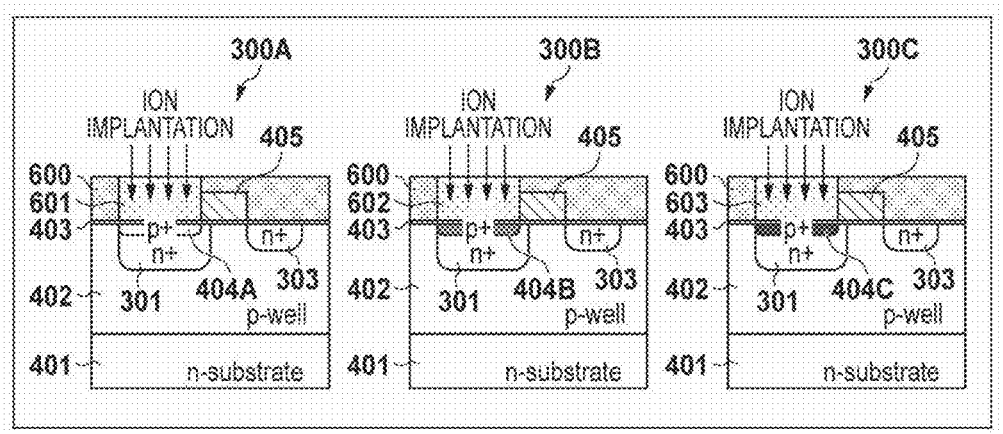
[Fig. 6C]
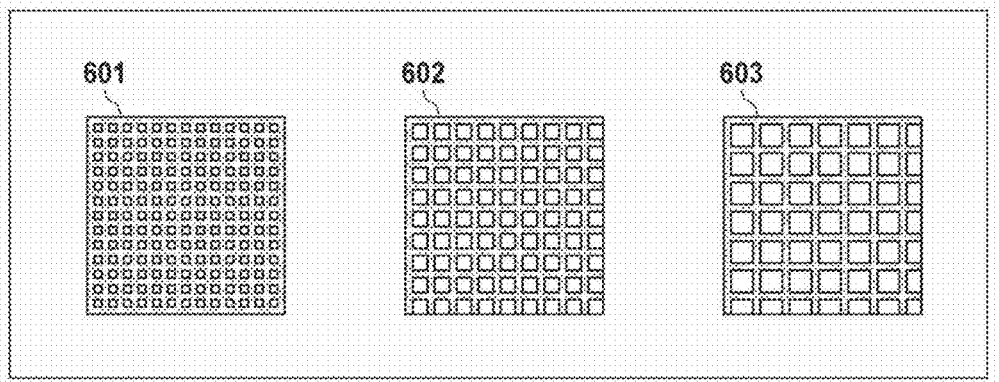

[Fig. 7]
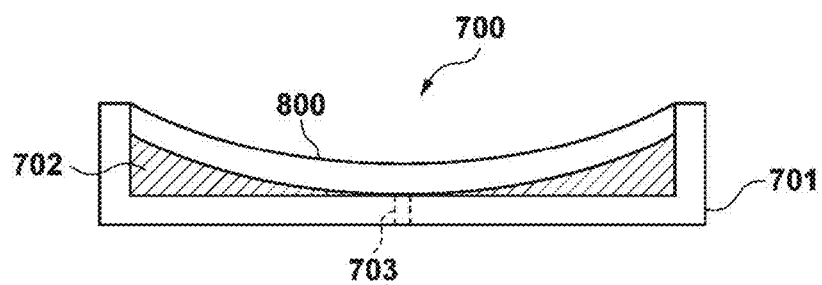
[Fig. 8]
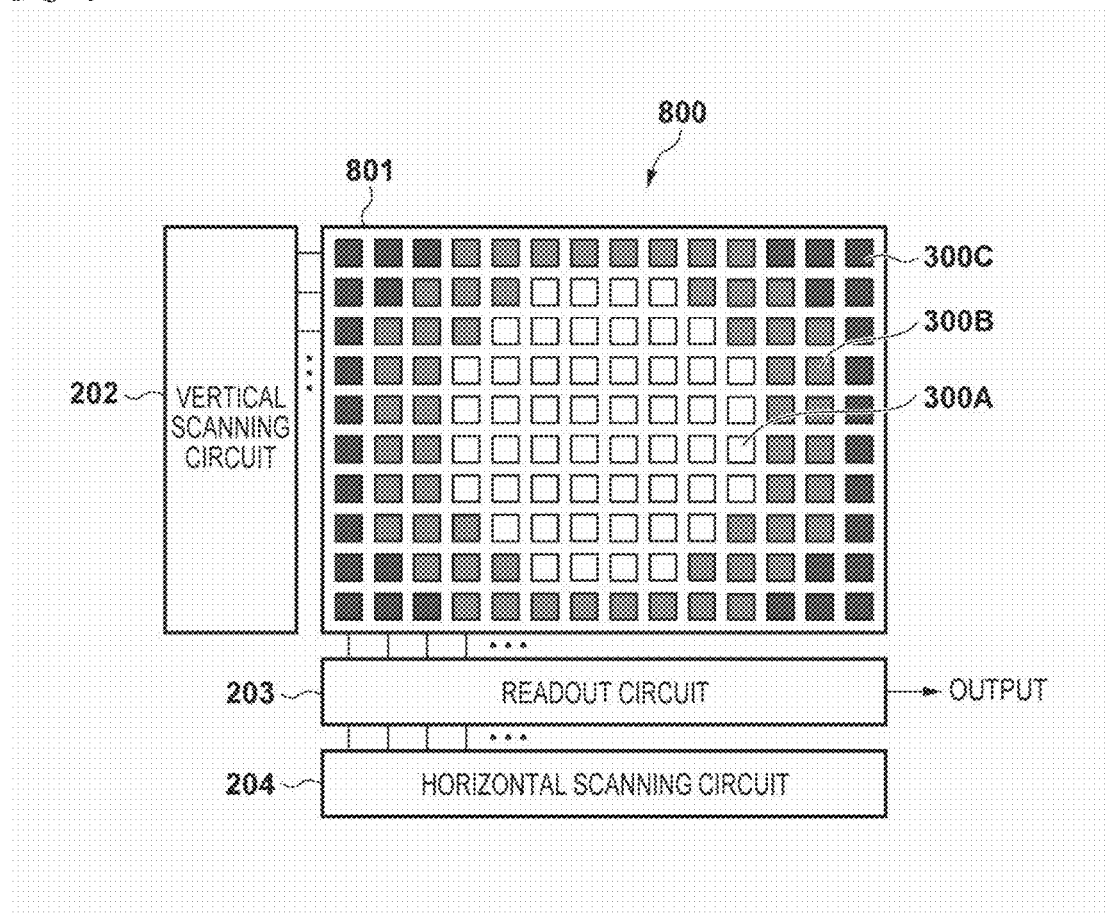

[Fig. 9]
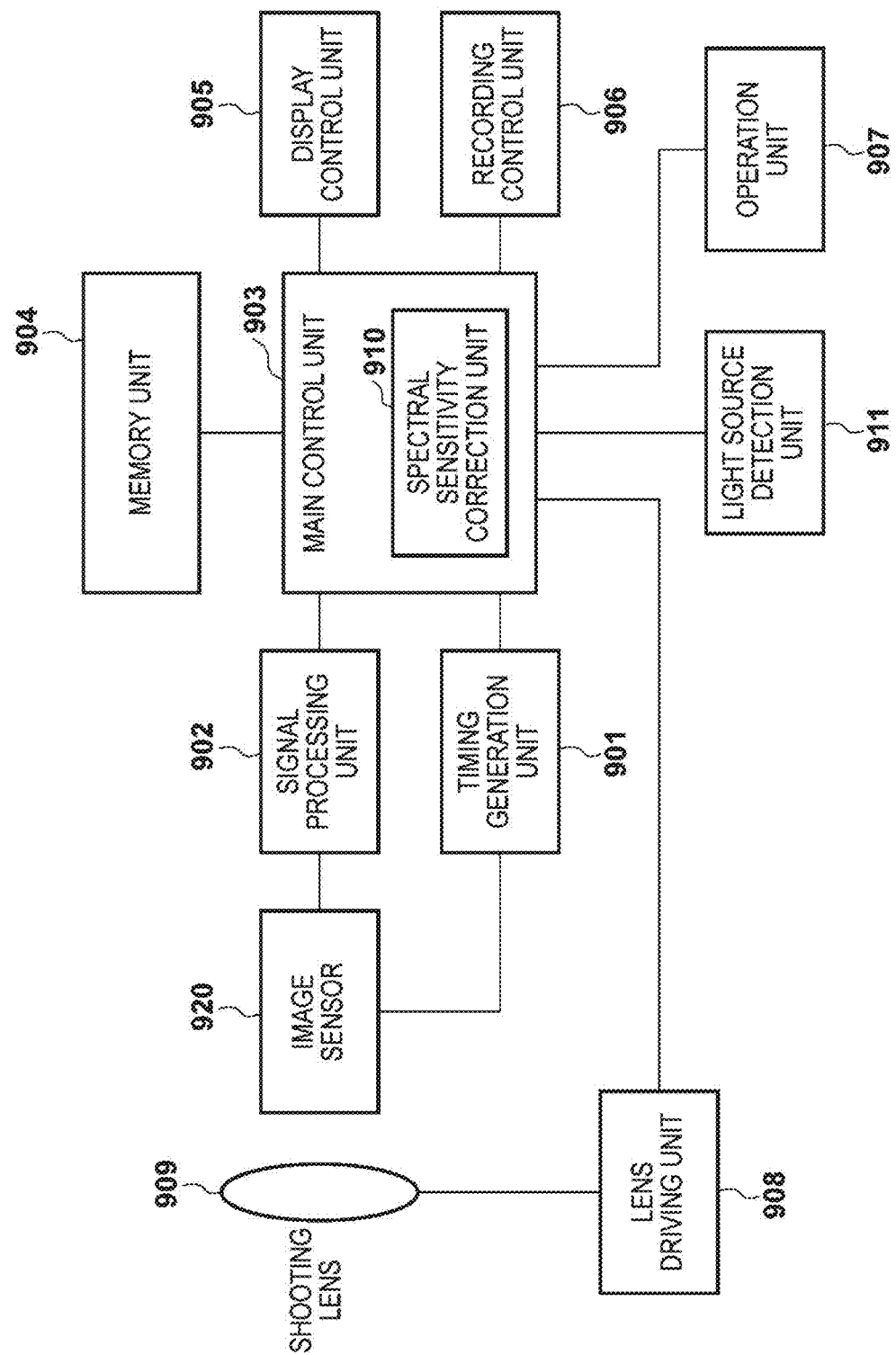

[Fig. 10]
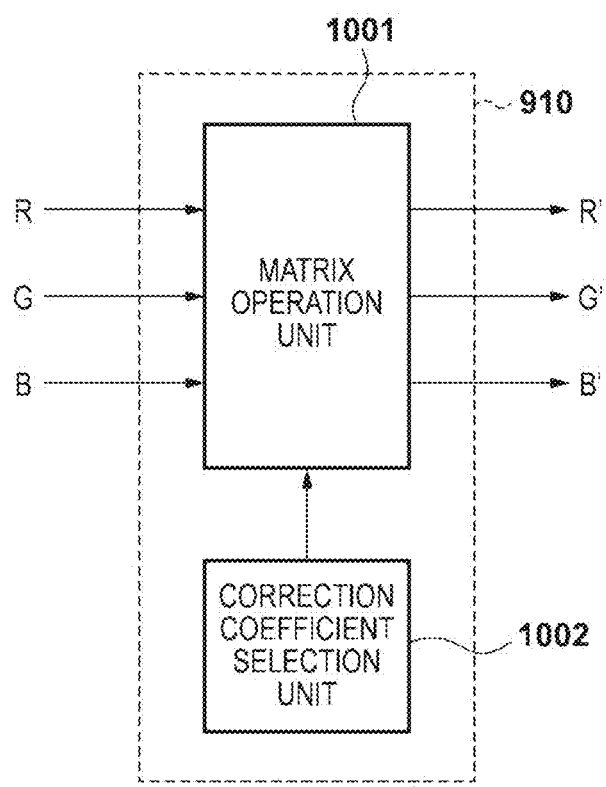

IMAGE SENSOR AND IMAGE CAPTURING APPARATUS

CROSS-REFERENCE TO RELATED APPLICATIONS

This application is a national stage application of International Application No. PCT/JP2016/003230 filed Jul. 7, 2016, whose benefit is claimed and which claims the benefit of Japanese Patent Application No. 2015-159135, filed Aug. 11, 2015, the entire disclosures of which are incorporated herein by reference.

TECHNICAL FIELD

The present invention relates to an image sensor and an image capturing apparatus.

BACKGROUND ART

In a CMOS image sensor, which is used in a digital single-lens reflex camera and a video camera, photodiodes that perform photoelectric conversion are two-dimensionally arranged on a flat semiconductor substrate.

When an image of an object on a plane is captured through a lens, an image is formed on a curved surface on the image plane side. The curved surface is concave relative to the lens. When this image is received by a flat image sensor, aberration called "curvature of field" occurs, and a difference is generated between the focal position in a central portion of the image sensor and the focal position in a peripheral portion of the image sensor. As a result, the image quality becomes not uniform in a central portion of the image and in a peripheral portion of the image, which leads to degradation in the image quality.

In order to improve such optical characteristics, Japanese Patent Laid-Open No. 2014-116380 discloses that it is possible to achieve the effect of correcting the curvature of field by forming the image sensor so as to be curved along a concaved surface. Also, Japanese Patent Laid-Open No. 2014-116380 discloses methods for manufacturing an image sensor having such a curved shape, namely a method by which the curved shape is formed by applying a magnetic field to a substrate made of magnetic material, and a method by which the curved shape is formed by generating tensile stress in a light-receiving portion.

Meanwhile, it is known that if tensile stress is generated in a semiconductor substrate in order to form the above-described curved shape, the energy bandgap of silicon expands, and dark current decreases. Within the imaging plane, due to such characteristics, variation in dark current occurs between a region where tensile stress is generated so as to form the curved shape and a region where tensile stress is not generated. Also, even if tensile stress is generated in the whole image plane, variation in dark current occurs within the imaging plane in a similar manner if there are differences in the magnitude of stress among regions. Variation in dark current within the imaging plane can be a cause of degradation in the image quality in the cases of long exposure shooting and shooting under a high-temperature environment, for example.

SUMMARY OF INVENTION

The present invention has been made in consideration of the aforementioned problems, and realizes an image sensor and an image capturing apparatus that are capable of supressing variation in dark current within the imaging plane while suppressing the curvature of field, and thus obtaining favorable images.

In order to solve the aforementioned problems, the present invention provides an image sensor in which at least a portion of an imaging plane thereof has a curved shape, characterized in that the imaging plane includes a plurality of pixels that are two-dimensionally arranged, each of the plurality of pixels having: a photoelectric conversion region that is provided with an impurity region of a first conductivity type that is formed in a semiconductor substrate; and an impurity region of a second conductivity type that is formed on a substrate surface side of the photoelectric conversion region, and impurity concentration in the impurity region of the second conductivity type varies depending on a position on the imaging plane.

In order to solve the aforementioned problems, the present invention provides an image capturing apparatus as set forth; and sensitivity correction means configured to correct sensitivity for each pixel region of the image sensor.

According to the present invention, it is possible to obtain favorable images by supressing variation in dark current within the imaging plane while suppressing the curvature of field.

Further features of the present invention will become apparent from the following description of exemplary embodiments (with reference to the attached drawings).

BRIEF DESCRIPTION OF DRAWINGS

The accompanying drawings, which are incorporated in and constitute a part of the specification, illustrate embodiments of the invention and, together with the description, serve to explain the principles of the invention.

FIG. 1 is a schematic cross-sectional view of an image sensor according to a first embodiment.

FIG. 2 is a block diagram showing a configuration of an imaging semiconductor substrate according to the first embodiment.

FIG. 3 is an equivalent circuit diagram for a unit pixel according to the first embodiment.

FIG. 4A is a cross-sectional view of main portions of unit pixels according to the first embodiment.

FIG. 4B is a cross-sectional view of main portions of unit pixels according to the first embodiment.

FIG. 4C is a cross-sectional view of main portions of unit pixels according to the first embodiment.

FIG. 5A is a diagram illustrating a method for forming a dark current suppression region according to the first embodiment.

FIG. 5B is a diagram illustrating a method for forming a dark current suppression region according to the first embodiment.

FIG. 5C is a diagram illustrating a method for forming a dark current suppression region according to the first embodiment.

FIG. 5D is a diagram illustrating a method for forming a dark current suppression region according to the first embodiment.

FIG. 6A is a diagram illustrating another method for forming a dark current suppression region according to the first embodiment.

FIG. 6B is a diagram illustrating another method for forming a dark current suppression region according to the first embodiment.

FIG. 6C is a diagram illustrating another method for forming a dark current suppression region according to the first embodiment.

FIG. 7 is a schematic cross-sectional view of an image sensor according to a second embodiment.

FIG. 8 is a block diagram showing a configuration of an imaging semiconductor substrate according to the second embodiment.

FIG. 9 is a block diagram showing a configuration of an image capturing apparatus according to a third embodiment.

FIG. 10 is a block diagram showing a configuration of a spectral sensitivity correction unit of the image capturing apparatus according to the third embodiment.

DESCRIPTION OF EMBODIMENTS

Embodiments of the present invention will be described in detail below. The following embodiments are merely examples for practicing the present invention. The embodiments should be properly modified or changed depending on various conditions and the structure of an apparatus to which the present invention is applied. The present invention should not be limited to the following embodiments. Also, parts of the embodiments to be described later may be properly combined.

First Embodiment

The following describes an embodiment of the present invention when applied to an image sensor used in an image capturing apparatus such as a digital single-lens reflex camera or a video camera. Note that the present invention is also applicable to other apparatuses that are equipped with an image sensor whose imaging plane has a curved shape.

First, a description is given of a schematic configuration of the image sensor according to the first embodiment of the present invention with reference to FIG. 1. An image sensor 100 includes a CMOS semiconductor substrate. An imaging semiconductor substrate 200, on which a plurality of pixels are two-dimensionally arranged, is supported on a supporting substrate 101 having a recessed shape. The imaging semiconductor substrate 200 has a curved shape in which a peripheral portion is raised as shown in the drawing. The gap between the supporting substrate 101 and the imaging semiconductor substrate 200 is filled with an adhesive 102, for example. The image sensor 100 with the imaging semiconductor substrate 200 having such a curved shape can be manufactured by using well-known technique. An example of well-known technique is a method by which a ventilation hole, which is not shown in the drawing, is provided in the supporting substrate 101, the gap between the imaging semiconductor substrate 200 and the supporting substrate 101 is evacuated using this ventilation hole, and thus stress is generated in the imaging semiconductor substrate 200 and the curved shape is formed.

As shown in FIG. 1, the imaging semiconductor substrate 200 has a curved shape in which the peripheral portion is raised, and thus the curvature of field in a peripheral portion of the imaging plane is reduced.

Next, a description is given of a configuration of the imaging semiconductor substrate 200 shown in FIG. 1 with reference to FIG. 2.

The imaging semiconductor substrate 200 includes a pixel region 201, a vertical scanning circuit 202, a readout circuit 203, and a horizontal scanning circuit 204. The pixel region 201 includes a plurality of unit pixels that are two-dimensionally arranged in the horizontal direction (or the row direction) and in the vertical direction (or the column direction), and receives light from a light from an object image formed by a lens. In the present embodiment, an array of 14×10 pixels is shown as an example, in order to simplify the description. Practically, however, a greater number of pixels are arranged.

In each pixel, red (R), green (G), and blue (B) color filters, which are not shown in the drawing, are arranged according to Bayer arrangement. The vertical scanning circuit 202 selects one row of pixels in the pixel region 201 at a time, and transmits a driving signal to the pixels in the selected row. The readout circuit 203 reads out signals from the pixels in the row that has been selected by the vertical scanning circuit 202. Pixel signals thus read out are sequentially output from the image sensor 100 due to the driving of the horizontal scanning circuit 204.

In the pixel region 201, a plurality of unit pixels 300A, 300B, and 300C are two-dimensionally arranged. As shown in the drawing, in the pixel region 201, the pixels 300C are arranged in a central portion, the pixels 300A are arranged in a peripheral portion, and the pixels 300B are arranged in an intermediate portion between the central portion and the peripheral portion. The pixels 300A, 300B, and 300C differ from each other in terms of dark current suppression effect. The degrees of their dark current suppression effect satisfy the following relationship: the dark current suppression effect of the pixels 300A< the dark current suppression effect of the pixels 300B< the dark current suppression effect of the pixels 300C. The detailed configuration of each pixel will be described later.

In the case of an image sensor having a curved shape in which a peripheral portion of the imaging plane is raised as shown in FIG. 1, stress is generated due to the curved shape of the peripheral portion, and therefore the dark current amount in the peripheral portion tends to be smaller than that in the central flat portion. Differences among relative dark current amounts within the imaging plane cause degradation in the image quality. Therefore, in the present embodiment, pixels having different degrees of dark current suppression effect are arranged within the imaging plane, considering the curved shape of the imaging semiconductor substrate 200. Specifically, as shown in FIG. 2, the pixels 300A having a small degree of dark current suppression effect are arranged in the peripheral portion of the imaging semiconductor substrate 200 having the curved shape, and the pixels 300C having a large degree of dark current suppression effect are arranged in a central region corresponding to the flat portion. Such an arrangement of pixels suppresses variation in dark current within the imaging plane of an image sensor having a curved shape.

Next, a description is given of equivalent circuits of the pixels 300A, 300B, and 300C shown in FIG. 2 having different degrees of dark current suppression effect with reference to FIG. 3.

Note that the equivalent circuits of the unit pixels 300A, 300B, and 300C are the same, and therefore FIG. 3 only shows one equivalent circuit.

A photodiode 301 receives light from light from an object image formed by a lens, and generates and accumulates electric charge. The electric charge accumulated in the photodiode 301 is transferred to a floating diffusion region 303 via a transfer MOS transistor 302. Upon a selection MOS transistor 306 being turned ON, the electric charge transferred to the floating diffusion region 303 is output to a column output line 307 as voltage corresponding to the accumulated electric charge, via an amplification MOS transistor 304 with which a source follower amplifier is formed. Note that the selection MOS transistor 306 is controlled for each row, and pixel signals from the selected row are output to the respective column output lines 307 of columns all at once. A reset MOS transistor 305 resets the electric potential of the photodiode 301 to the electric potential of a pixel power supply VDD via the floating diffusion region 303 and the transfer MOS transistor 302. The transfer MOS transistor 302, the reset MOS transistor 305, and the selection MOS transistor 306 are respectively controlled using a control signal PTX, a control signal PRES, and a control signal PSEL provided via signal lines connected to the vertical scanning circuit 202.

Next, a description is given of a cross-sectional configuration of a main portion of the unit pixel shown in FIG. 3 with reference to FIGS. 4A to 4C.

FIGS. 4A to 4C show cross-sectional configurations of the respective main portions of the unit pixels 300A, 300B, and 300C shown in FIG. 3. Elements that are the same in these drawings are indicated by the same reference numerals. Note that the amplification MOS transistor 304, the reset MOS transistor 305, the selection MOS transistor 306, and an interconnect layer shown in the equivalent circuit diagram in FIG. 3 are omitted from FIGS. 4A to 4C.

As shown in FIGS. 4A to 4C, in each of the unit pixels 300A, 300B, and 300C, a well region 402 provided with an impurity region of a p-type, which is a second conductivity type, is formed in a semiconductor substrate 401 of an n-type, which is a first conductivity type. In the well region 402, the photodiode 301, which is a photoelectric conversion region provided with an impurity region of the n-type, and the floating diffusion region 303, which is also provided with an impurity region of the n-type, are formed. The region between the photodiode 301 and the floating diffusion region 303 functions as a channel region (not shown in the drawings) of the transfer MOS transistor 302, and a gate electrode 405 is formed above the channel region, with a gate oxide film 403 interposed therebetween.

A dark current suppression region 404A, which is a surface region provided with an impurity region of the p-type, is formed on the substrate surface side of the photodiode 301 shown in FIG. 4A. The photodiode 301 is embedded due to the presence of the dark current suppression region 404A. Also, the gate electrode 405 of the transfer MOS transistor 302 and the photodiode 301 are formed so as to overlap each other. Thus, the dark current suppression region 404A is prevented from affecting the channel region of the transfer MOS transistor 302 and hindering the transfer of electric charge.

In the dark current suppression region 404A, electrons resulting from the interface state of the substrate surface, which causes dark current, are subjected to pinning by holes. Holes are the majority carriers in the p-type impurity region. The generation of dark current can thus be prevented. In a dark current suppression region 404B of the pixel 300B shown in FIG. 4B and a dark current suppression region 404C of the pixel 300C shown in FIG. 4C, impurity concentration is further increased so that the strength of pinning at the substrate surface is increased, and the generation of dark current can be further prevented. For example, when the impurity concentration in the photodiode 301 is approximately $1 \times 10^{17}$ cm$^{-3}$, the impurity concentration in the dark current suppression region 404A is set to approximately $1 \times 10^{18}$ cm$^-$, the impurity concentration in the dark current suppression region 404B is set to approximately $1.5 \times 10^{18}$ cm$^{-3}$, and the impurity concentration in the dark current suppression region 404C is set to approximately $2 \times 10^{18}$ cm$^{-3}$.

In this way, the degrees of impurity concentration in the dark current suppression regions of the pixels 300A, 300B, and 300C are set so as to satisfy the following relationship: the impurity concentration in the pixels 300A< the impurity concentration in the pixels 300B< the impurity concentration in the pixels 300C. Consequently, it is possible to set the dark current suppression effect of the pixels 300A, 300B, and 300C so as to satisfy the following relationship: the dark current suppression effect of the pixels 300A< the dark current suppression effect of the pixels 300B< the dark current suppression effect of the pixels 300C. Therefore, the pixels 300A that have a relatively low degree of dark current suppression effect are arranged in the peripheral portion, which has the curved shape, of the imaging semiconductor substrate 200, and the pixels 300C that have the highest degree of dark current suppression effect are arranged in the central region corresponding to the flat portion. The pixels 300B are arranged between the pixels 300A and the pixels 300C. Such an arrangement of pixels having different degrees of dark current suppression effect suppresses variation in dark current within the imaging plane of the imaging semiconductor substrate 200 having a curved shape.

Although the impurity concentration in the dark current suppression region of each pixel is set on a three-level scale in the present embodiment, it may be further divided into a greater number of levels. Also, the conductivity type of the semiconductor substrate and each impurity region is not limited to the present embodiment. For example, a well of the n-type, which is the first conductivity type, may be formed in a semiconductor substrate of the p-type, which is the second conductivity type, and a photodiode provided with an impurity region of the p-type, and a dark current suppression region provided with an impurity region of the n-type, may be formed. Alternatively, a photodiode provided with an impurity region of the n-type, and a dark current suppression region provided with an impurity region of the p-type, may be formed in the p-type semiconductor substrate without the well of the n-type being formed.

Next, with reference to FIGS. 5A to 5D, a description is given of a method for forming the pixels 300A, 300B, and 300C in which the degrees of impurity concentration in the dark current suppression regions differ from each other.

First, as shown in FIG. 5A, the photodiode 301 provided with an n-type impurity region, and the floating diffusion region 303 also provided with an n-type impurity region, are formed within the p-type well region 402 formed in the n-type semiconductor substrate 401. Also, the gate electrode 405 of the transfer MOS transistor 302, which is not shown in the drawing, is formed above the semiconductor substrate 401, with the gate oxide film 403 interposed therebetween. A description of this process is omitted because this process can be realized by using an existing method. Also, the order in which the regions are formed is not limited to the above-described order. For example, the floating diffusion region 303 may be formed after the dark current suppression region described below is formed.

Next, as shown in FIG. 5B, after the process shown in FIG. 5A, a top part of the photodiode 301 of each of the pixels 300A, 300B, and 300C is exposed, and a resist pattern 501 covering the other part is formed. Then, p-type impurity ions (e.g. boron ions) are implanted into the semiconductor substrate 401 from an aperture of the resist pattern 501, and thus the dark current suppression region 404A is formed. Note that the gate electrode 405 may be used instead of the resist, as a masking material for a surface where the dark current suppression region 404A and the gate electrode 405 overlap each other.

Next, as shown in FIG. 5C, the resist pattern 501 formed in FIG. 5B is removed, and thereafter a resist pattern 502 is formed such that the top part of the photodiode 301 of each of the pixels 300B and 300C is exposed from the resist pattern 502 and the other part is covered by the resist pattern 502. Then, the p-type impurity ions are implanted into the semiconductor substrate 401 through the aperture of the resist pattern 502 again, and thus the dark current suppression region 404B is formed in the pixels 300B and 300C. By performing ion implantation a plurality of times (twice), the impurity concentration in the dark current suppression region 404B is set to be higher than the impurity concentration in the dark current suppression region 404A.

Finally, as shown in FIG. 5D, the resist pattern 502 formed in FIG. 5C is removed, and thereafter a resist pattern 503 is formed such that the top part of the photodiode 301 of the pixel 300C is exposed from the resist pattern 503 and the other part is covered by the resist pattern 503. Then, the p-type impurity ions are implanted into the semiconductor substrate 401 through the aperture of the resist pattern 503 again, and thus the dark current suppression region 404C is formed in the pixel 300C. By performing ion implantation a plurality of times (three times), the impurity concentration in the dark current suppression region 404C is set to be higher than the impurity concentration in the dark current suppression region 404B.

As a result of applying the above-described method, the degrees of impurity concentration in the dark current suppression regions 404A, 404B, and 404C of the pixels 300A, 300B, and 300C satisfy the following relationship: the impurity concentration in the region 404A< the impurity concentration in the region 404B< the impurity concentration in the region 404C.

As described above, according to the present embodiment, it is possible to form dark current suppression regions of the pixels such that the impurity concentration is different for each pixel.

Also, ion implantation is performed for each pixel, and the dark current suppression regions of the pixels can be formed such that the impurity concentration is different for each pixel by changing the amount of beam current and the duration of implantation.

Note that ion implantation in FIGS. 5B to 5D may be performed from a direction that is diagonal to the dark current suppression region 404A, using the gate electrode 405 as a masking material. If this is the case, an offset is provided between the gate electrode 405 and the dark current suppression region 404A, and the dark current suppression region 404A is prevented from affecting the channel region of the transfer MOS transistor 302 and hindering the transfer of electric charge.

Next, with reference to FIGS. 6A to 6C, a description is given of another method for forming the pixels 300A, 300B, and 300C in which the degrees of impurity concentration in the dark current suppression regions differ from each other.

First, in FIG. 6A, in the same manner as in FIG. 5A, the photodiode 301 and the floating diffusion region 303 are formed within the p-type well region 402. Also, the gate electrode 405 of the transfer MOS transistor 302, which is not shown in the drawing, is formed above the semiconductor substrate 401 with the gate oxide film 403 interposed therebetween.

Next, as shown in FIG. 6B, a resist pattern 600 is formed on the substrate surface. In the resist patterns 600 of the pixels 300A, 300B, and 300C, patterns 601, 602, and 603, each in which small portions of resist material am remained when seen from the above as shown in FIG. 6C, are formed on the regions corresponding to the photodiodes 301 of the pixels 300A, 300B and 300C. The resist patterns 601, 602, and 603 are different from each other in terms of the proportion between the apertures provided at regular intervals and the remaining portions of resist material. The degrees of aperture ratio satisfy the following relationship: the aperture ratio of the pattern 601< the aperture ratio of the pattern 602< the aperture ratio of the pattern 603. P-type impurity ions (e.g. boron ions) are implanted into the semiconductor substrate 401 via the resist patterns 601, 602, and 603, and thus the dark current suppression regions 404A, 404B, and 404C are formed. As a result, the degrees of impurity concentration in the dark current suppression regions 404A, 404B, and 404C of the pixels 300A, 300B, and 300C can be formed so as to satisfy the following relationship: the impurity concentration in the region 404A< the impurity concentration in the region 404B< the impurity concentration in the region 404C. If the intervals between the apertures provided in each of the resist patterns 601, 602, and 603 are sufficiently small, it is possible to uniformly implant ions into the dark current suppression regions 404A, 404B, and 404C by utilizing the implanted ions moving around or applying heat diffusion processing.

As a result of applying the above-described method, it is possible to form the dark current suppression regions 404A, 404B, and 404C each having a different degree of impurity concentration by performing ion implantation once. Also, by gradually changing the aperture ratios of the resist patterns 601, 602, and 603 of the pixels from each other, it is also possible to continuously changing the degrees of impurity concentration in the dark current suppression regions 404A, 404B, and 404C of the pixels from each other.

As described above, in an image sensor having a curved shape, it is possible to obtain favorable images by changing the degrees of impurity concentration in the dark current suppression regions of the pixels according to the curved shape, thereby supressing variation in dark current within the imaging plane while suppressing the curvature of field.

Also, when the present invention is applied to an image sensor having a curved shape in which the flat portion is not provided and the curvature is changed for each region, the impurity concentration in the dark current suppression region of the pixel having a smaller curvature is set to be higher according to the curvature of the curved portion. This configuration effectively supresses variation in dark current within the imaging plane.

Second Embodiment

The magnitude of stress generated within the imaging plane of an imaging semiconductor substrate having a curved shape varies depending on the curved shape and the manufacturing method. The present embodiment provides a description of an example where the present invention is applied to an imaging semiconductor substrate having a curved shape that is different from the curved shape in the first embodiment.

First, a description is given of a schematic configuration of an image sensor according to the second embodiment with reference to FIG. 7.

An image sensor 700 includes a CMOS semiconductor substrate. An imaging semiconductor substrate 800, on which a plurality of pixels are two-dimensionally arranged, is supported on a supporting substrate 701 having a recessed shape. The imaging semiconductor substrate 800 has a spherical shape, and does not have a flat portion in a central region thereof. The gap between the supporting substrate 701 and the imaging semiconductor substrate 800 is filled with an adhesive 702, for example. The spherical shape of the imaging semiconductor substrate 800 reduces the curvature of field.

The imaging semiconductor substrate 800 having a spherical shape can also be manufactured by using well-known technique as described in the first embodiment. When the curved shape is a spherical shape, the curvature is substantially constant throughout the imaging plane. However, in some cases, stress generated in the imaging semiconductor substrate 800 during the manufacturing varies for each region depending on the manufacturing conditions. For example, if a ventilation hole 703 is formed in a central portion of the imaging semiconductor substrate 800, and the curved shape is formed by evacuation through the ventilation hole 703, stress generated in the central portion of the imaging semiconductor substrate 800 is, in some cases, greater than stress generated in a peripheral portion thereof. In such a case, dark current is characterized in that the amount thereof is the smallest in the central region of the imaging semiconductor substrate 800, and increases towards the peripheral portion.

Next, a description is given of a configuration of the imaging semiconductor substrate 800 with reference to FIG. 8.

Note that FIG. 8 corresponds to FIG. 2 of the first embodiment, and elements that are the same as in the first embodiment are indicated by the same reference numerals.

In a pixel region 801, a plurality of unit pixels 300A, 300B, and 300C are two-dimensionally arranged. As described for FIGS. 4A to 4C, the degrees of impurity concentration in the dark current suppression regions of the unit pixels 300A, 300B, and 300C are different from each other. The degrees of impurity concentration in the dark current suppression regions 404A, 404B, and 404C of the pixels 300A. 300B, and 300C are set so as to satisfy the following relationship: the impurity concentration in the pixels 300A< the impurity concentration in the pixels 300B< the impurity concentration in the pixels 300C. Therefore, the degrees of dark current suppression effect satisfy the following relationship: the dark current suppression effect of the pixels 300A< the dark current suppression effect of the pixels 300B< the dark current suppression effect of the pixels 300C. As shown in FIG. 8, the pixels 300A that have a low degree of dark current suppression effect are arranged in the central portion of the pixel region in which a large degree of stress is generated, the pixels 300C that have a high degree of dark current suppression effect are arranged in the peripheral portion in which a small degree of stress is generated, and the pixels 300B are arranged between the pixels 300A and the pixels 300C.

Such an arrangement suppresses variation in dark current within the imaging plane. Note that the configurations of the pixels 300A. 300B, and 300C and the method for forming them are the same as those in the first embodiment.

Third Embodiment

As in the above-described first and second embodiments, if the degrees of impurity concentration in the dark current suppression regions 404A to 404C that are of the conductivity type opposite to the conductivity type of the photodiodes 301 are set to be high, electric charge collection in the vicinity of the surfaces of the photodiodes 301 is hindered, and the spectral sensitivity of the photodiodes 301 changes. As a result, in the image sensor having the R, G and B color filters, the color ratios of the R, G, and B colors differ between the dark current suppression regions in which the degrees of impurity concentration are different from each other. In light of this problem, the third embodiment describes a configuration in which a spectral sensitivity correction unit that corrects changes in the spectral sensitivity is provided in an image capturing apparatus 900 in which the image sensor 100 according to the first embodiment or the image sensor 700 according to the second embodiment is used.

First, a description is given of a configuration of the image capturing apparatus 900 according to the present embodiment with reference to FIG. 9.

A shooting lens 909 forms an optical image of an object on an image sensor 920, and a lens driving unit 908 performs zoom control, focus control, aperture control, and so on. The image sensor 920 is a photoelectric conversion sensor for taking in the light from the object image, which has been formed by the shooting lens 909, as an electric signal, and is the same as the image sensor 100 according to the first embodiment and the image sensor 700 according to the second embodiment each having a curved shape. A timing generation unit 901 transmits a driving signal for driving the image sensor 920. A signal processing unit 902 performs signal processing, such as clamp processing, on the image signal output from the image sensor 920. A main control unit 903 performs various kinds of operations and control processing for controlling the whole apparatus. Also, the main control unit 903 is provided with a spectral sensitivity correction unit 910.

The spectral sensitivity correction unit 910 has the function of correcting changes in the spectral sensitivity caused by differences between the degrees of impurity concentration in the dark current suppression regions (the details will be described later). A light source detection unit 911 detects the type of the light source in the shooting environment. The detected light source information is used for white balance setting performed by the main control unit 903, or is used by the spectral sensitivity correction unit 910 described later. A memory 904 temporarily stores image data. A display control unit 905 displays various kinds of information and a captured image on a display apparatus such as an LCD. A recording control unit 906 writes and reads out image data to and from a recording medium such as a detachable semiconductor memory, for example. An operation unit 907 includes a button, a dial, and so on, and receives an operational input from a user. When the display apparatus is a touch panel, the touch panel is also included in the operation unit 907.

Next, a description is given of a detailed configuration of the spectral sensitivity correction unit 910 with reference to FIG. 10.

The spectral sensitivity correction unit 910 includes a matrix operation unit 1001 and a correction coefficient selection unit 1002.

The matrix operation unit 1001 receives a predetermined unit of color signals (R. G. B) output from the image sensor 920, and performs a matrix operation as shown in equation 1 below. Consequently, the matrix operation unit 1001 outputs signals (R', G', B') in which changes in the spectral sensitivity caused by differences between the degrees of impurity concentration in the dark current suppression regions have been corrected.

$$\begin{pmatrix} R' \\ G' \\ B' \end{pmatrix} = \begin{pmatrix} M_{11} & M_{12} & M_{13} \\ M_{21} & M_{22} & M_{23} \\ M_{31} & M_{32} & M_{33} \end{pmatrix} \begin{pmatrix} R \\ G \\ B \end{pmatrix} \quad (1)$$

In equation 1, M11 to M33 denote spectral sensitivity correction coefficients. By appropriately setting these correction coefficients, it is possible to obtain, in a predetermined lighting environment, substantially the same color in a reference pixel region and in a pixel region in which the impurity concentration in the dark current suppression region has been changed.

The correction coefficient selection unit 1002 changes the spectral sensitivity correction coefficient for each pixel region. Consequently, it is possible to select an appropriate correction coefficient for each of the pixel regions in which the degrees of impurity concentration in the dark current suppression regions are different from each other.

Next, a description is given of a method for determining the spectral sensitivity correction coefficients M11 to M33, taking the pixel region 801 shown in FIG. 8 as an example. Here, as shown in FIG. 8, a central region in which the pixels 300A are arranged is determined as a reference region in terms of the spectral sensitivity. Ra, Ga and Ba denote color signals obtained from the central region in which the pixels 300A are arranged, Rb, Gb, and Bb denote color signals obtained from an intermediate region in which the pixels 300B are arranged, and Rc, Gc, and Bc denote color signals obtained from a peripheral region in which the pixels 300C are arranged.

First, during the process of performing an adjustment or the like to the image capturing apparatus 900, an image of an object having a plurality of colors that are each uniform (e.g. a color chart) is captured under a light source having a standard color temperature of 5000K for example.

Then, with respect to the intermediate region in which the pixels 300B are arranged, values e11 to e33 that are the most suited to equation 2 below with respect to all the colors in the object, are obtained using the captured image. These values are set to the spectral sensitivity correction coefficients M11 to M33.

$$\begin{pmatrix} R_a \\ G_a \\ B_a \end{pmatrix} \cong \begin{pmatrix} e_{11} & e_{12} & e_{13} \\ e_{21} & e_{22} & e_{23} \\ e_{31} & e_{32} & e_{33} \end{pmatrix} \begin{pmatrix} R_b \\ G_b \\ B_b \end{pmatrix} \quad (2)$$

With respect to the peripheral region in which the pixels 300C are arranged, values f11 to f33 that are the most suited to equation 3 below with respect to all the colors in the object are obtained. These values are set to the spectral sensitivity correction coefficients M11 to M33.

$$\begin{pmatrix} R_a \\ G_a \\ B_a \end{pmatrix} \cong \begin{pmatrix} f_{11} & f_{12} & f_{13} \\ f_{21} & f_{22} & f_{23} \\ f_{31} & f_{32} & f_{33} \end{pmatrix} \begin{pmatrix} R_c \\ G_c \\ B_c \end{pmatrix} \quad (3)$$

With respect to the central region, which is the reference region in terms of the spectral sensitivity and in which the pixels 300A are arranged, the spectral sensitivity correction coefficients M11 to M33 shown in equation 4 below are used. That is to say, the spectral sensitivity correction is not performed for this region.

$$\begin{pmatrix} M_{11} & M_{12} & M_{13} \\ M_{21} & M_{22} & M_{23} \\ M_{31} & M_{32} & M_{33} \end{pmatrix} = \begin{pmatrix} 1 & 0 & 0 \\ 0 & 1 & 0 \\ 0 & 0 & 1 \end{pmatrix} \quad (4)$$

As described above, the spectral sensitivity correction coefficients are switched for each pixel region by the correction coefficient selection unit 1002, and thus changes in the spectral sensitivity caused by differences between the degrees of impurity concentration in the dark current suppression regions can be corrected.

Alternatively, it is acceptable that, during the process of performing an adjustment or the like to the image capturing apparatus 900, spectral sensitivity correction coefficients under a plurality of types of light sources are obtained in advance, and the spectral sensitivity correction coefficients are switched according to the type of the light source in the shooting environment, detected by the light source detection unit 911 shown in FIG. 9.

The above-described image capturing apparatus 900 is capable of supressing variation in dark current within the imaging plane while suppressing the curvature of field. Furthermore, the image capturing apparatus 900 is capable of obtaining a favorable image by correcting differences in the spectral sensitivity within the imaging plane, caused by differences between the degrees of impurity concentration in the dark current suppression regions, using the spectral sensitivity correction unit 910.

Note that regarding the image sensor 920 described in the present embodiment, the configurations, the curved shape, and the arrangement of the pixels, in which the degrees of impurity concentration in the dark current suppression regions are varied, are merely examples, and the present invention is not limited to these examples. Also, although the image sensor 920 according to the present embodiment is a front side illumination type CMOS, the present invention is not limited to this. For example, the present invention is applicable to a backside illumination type image sensor or a stacked type image sensor. For example, when the present invention is applied to a stacked type image sensor in which an imaging semiconductor substrate and a signal processing semiconductor substrate are stacked, a configuration may be adopted in which processing by the spectral sensitivity correction unit 910 is performed by the signal processing semiconductor substrate.

The present invention is not limited to the above embodiments and various changes and modifications can be made within the spirit and scope of the present invention. Therefore, to apprise the public of the scope of the present invention the following claims are made.

This application claims the benefit of Japanese Patent Application No. 2015-159135, filed Aug. 11, 2015, which is hereby incorporated by reference herein in its entirety.

The invention claimed is:

1. An image sensor in which at least a portion of an imaging plane thereof has a curved shape, wherein the imaging plane includes a plurality of pixels that are two-dimensionally arranged, each of the plurality of pixels having: a photoelectric conversion region that is provided with an impurity region of a first conductivity type that is formed in a semiconductor substrate; and an impurity region of a second conductivity type that is formed on a substrate surface side of the photoelectric conversion region, and impurity concentration in the impurity region of the second conductivity type varies depending on a position on the imaging plane and a relative dark current amount in the corresponding photoelectric conversion region.

2. The image sensor according to claim 1, wherein curvature of the imaging plane varies depending on a position on the imaging plane, and the impurity concentration in the impurity region of the second conductivity type varies depending on the curvature of the imaging plane.

3. The image sensor according to claim 2, wherein the impurity concentration in the impurity region of the second conductivity type is higher in a region of the imaging plane in which the curvature of the imaging plane is smaller.

4. The image sensor according to claim 1, wherein stress generated in the imaging plane varies depending on a position on the imaging plane, and the impurity concentration in the impurity region of the second conductivity type varies depending on the stress generated in the imaging plane.

5. The image sensor according to claim 4, wherein the impurity concentration in the impurity region of the second conductivity type is higher in a region of the imaging plane in which the stress that is generated is smaller.

6. The image sensor according to claim 1, wherein the impurity concentration in the impurity region of the second conductivity type is higher in a region where the relative dark current amount in the corresponding photoelectric conversion region is greater.

7. The image sensor according to claim 1, wherein the impurity region of the second conductivity type is formed by implanting an impurity of the second conductivity type by performing ion implantation a plurality of times for each of the plurality of pixels.

8. The image sensor according to claim 1, wherein the impurity region of the second conductivity type is formed by implanting an impurity of the second conductivity type by performing ion implantation through a resist pattern provided with apertures arranged at regular intervals, for each of the plurality of pixels.

9. The image sensor according to claim 8, wherein an aperture ratio of the apertures arranged at the regular intervals is greater in a region in which the impurity concentration in the corresponding impurity region of the second type is higher.

10. The image sensor according to claim 1, wherein an electrode that partially overlaps the photoelectric conversion region is formed above the semiconductor substrate.

11. The image sensor according to claim 1, wherein the imaging plane includes a peripheral portion having a curved shape and a flat portion located in a central region of the imaging plane, and
the impurity concentration in the impurity region of a pixel in the flat portion is higher than the impurity concentration of the impurity region of a pixel in the peripheral portion.

12. The image sensor according to claim 11, wherein the curved shape is a spherical shape, and
the impurity concentration in the impurity region of a pixel in a peripheral portion of the imaging plane is higher than the impurity concentration of the impurity region of a pixel in the central region.

13. An image capturing apparatus comprising:
an image sensor in which at least a portion of an imaging plane thereof has a curved shape, wherein the imaging plane includes a plurality of pixels that are two-dimensionally arranged, each of the plurality of pixels having a photoelectric conversion region that is provided with an impurity region of a first conductivity type that is formed in a semiconductor substrate and an impurity region of a second conductivity type that is formed on a substrate surface side of the photoelectric conversion region, and impurity concentration in the impurity region of the second conductivity type varies depending on a position on the imaging plane and a relative dark current amount in the corresponding photoelectric conversion region; and
a sensitivity correction circuit that corrects sensitivity for each pixel region of the image sensor.

14. The apparatus according to claim 13, wherein the sensitivity correction circuit corrects spectral sensitivity according to the impurity concentration in the impurity region of each of the plurality of pixels.

* * * * *